(12) United States Patent
Bertness

(10) Patent No.: US 6,304,087 B1
(45) Date of Patent: Oct. 16, 2001

(54) APPARATUS FOR CALIBRATING ELECTRONIC BATTERY TESTER

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/654,715

(22) Filed: Sep. 5, 2000

(51) Int. Cl.[7] .............................. H01J 7/00; G01N 27/416
(52) U.S. Cl. ............................. 324/426; 324/433; 320/132
(58) Field of Search .................................. 324/430, 426, 324/432, 433; 320/132, 134, 136

(56) References Cited

U.S. PATENT DOCUMENTS

| 2,514,745 | 7/1950 | Dalzell | 171/95 |
|---|---|---|---|
| 3,356,936 | 12/1967 | Smith | 324/29.5 |

(List continued on next page.)

FOREIGN PATENT DOCUMENTS

| 0 022 450 A1 | 1/1981 | (EP) . |
|---|---|---|
| 29 26 716 B1 | 1/1981 | (DE) . |
| 0 637 754 A1 | 2/1995 | (EP) . |
| 0 772 056 A1 | 5/1997 | (EP) . |
| 2 749 397 | 12/1997 | (FR) . |
| 2 088 159 | 6/1982 | (GB) . |
| 5-9017894 | 1/1984 | (JP) . |
| 59-17892 | 1/1984 | (JP) . |
| 59-17893 | 1/1984 | (JP) . |
| 59-17894 | 1/1984 | (JP) . |
| 59245674 | 12/1984 | (JP) . |
| 60225078 | 11/1985 | (JP) . |
| 62-180284 | 8/1987 | (JP) . |
| 3-274479 | 12/1991 | (JP) . |
| 3-282276 | 12/1991 | (JP) . |
| 4-131779 | 5/1992 | (JP) . |
| 4-372536 | 12/1992 | (JP) . |
| 5-2166550 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

"Electrochemical Impedance Spectroscopy in Battery Development and Testing", Batteries International, Apr. 1997, pp. 59 and 62–63.

"Battery Impedance", by E. Willihnganz et al., Electrical Engineering, Sep. 1959, pp. 922–925.

(List continued on next page.)

Primary Examiner—Peter S. Wong
Assistant Examiner—Gregory J Toatley, Jr.
(74) Attorney, Agent, or Firm—Westman, Champlin & Kelly, P.A.

(57) ABSTRACT

A calibration fixture is provided for calibrating an electronic battery tester which has first and second battery tester Kelvin connections configured to couple to terminals of a battery. The calibration fixture includes a first Kelvin connection has an A' terminal and a C' terminal configured to couple to the first battery tester Kelvin connection and a second Kelvin connection having a B' terminal and a D' terminal configured to couple to the second battery tester Kelvin connection. A calibrated shunt is in series with a power supply connected between the A' terminal of the first Kelvin connection and the B' terminal of the second Kelvin connection. The calibrated shunt has a calibrated resistance value. An active shunt is placed in series between the C' terminal of the first Kelvin connection and the D' terminal of the second Kelvin connection. The active shunt provides a calibrated apparent resistance between the C' and D' terminal which is a function of the calibrated resistance value of the calibrated shunt.

20 Claims, 4 Drawing Sheets

U.S. PATENT DOCUMENTS

| | | | |
|---|---|---|---|
| 3,562,634 | 2/1971 | Latner | 31/4 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/66 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell 'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | * 8/1992 | Champlin | 324/433 |
| 5,144,218 | 9/1992 | Bosscha | 320/44 |
| 5,144,248 | 9/1992 | Alexandres et al. | 324/428 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Masumoto et al. | 320/20 |
| 5,449,997 | 9/1995 | Gilmore et al. | 320/39 |
| 5,451,881 | * 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,546,317 | 8/1996 | Andrieu | 364/481 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,656,920 | 8/1997 | Cherng et al. | 320/31 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/6 |
| 5,717,336 | 2/1998 | Basell et al. | 324/430 |

| | | | |
|---|---|---|---|
| 5,717,937 | 2/1998 | Fritz | 395/750.01 |
| 5,757,192 | 5/1998 | McShane et al. | 324/427 |
| 5,760,587 | 6/1998 | Harvey | 324/434 |
| 5,773,978 * | 6/1998 | Becker | 324/430 |
| 5,789,899 | 8/1998 | van Phuoc et al. | 320/30 |
| 5,793,359 | 8/1998 | Ushikubo | 345/169 |
| 5,808,469 | 9/1998 | Kopera | 324/43.4 |
| 5,821,756 | 10/1998 | McShane et al. | 324/430 |
| 5,831,435 | 11/1998 | Troy | 324/426 |
| 5,862,515 | 1/1999 | Kobayashi et al. | 702/63 |
| 5,872,443 | 2/1999 | Williamson | 320/21 |
| 5,914,605 | 6/1999 | Bertness | 324/430 |
| 5,929,609 | 7/1999 | Joy et al. | 322/25 |
| 5,945,829 | 8/1999 | Bertness | 324/430 |
| 6,002,238 | 12/1999 | Champlin | 320/134 |
| 6,008,652 | 12/1999 | Theofanopoulos et al. | 324/434 |
| 6,009,369 | 12/1999 | Boisvert et al. | 701/99 |
| 6,031,354 | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 | 6/2000 | Kurie et al. | 320/112 |
| 6,072,300 | 6/2000 | Tsuji | 320/116 |
| 6,081,098 | 6/2000 | Bertness et al. | 320/134 |
| 6,091,245 | 7/2000 | Bertness | 324/426 |
| 6,094,033 | 7/2000 | Ding et al. | 320/132 |
| 6,104,167 | 8/2000 | Bertness et al. | 320/132 |
| 6,137,269 | 10/2000 | Champlin | 320/150 |
| 6,163,156 | 12/2000 | Bertness | 324/426 |
| 6,172,483 | 1/2001 | Champlin | 320/134 |
| 6,172,505 | 1/1901 | Bertness | 324/430 |

OTHER PUBLICATIONS

"Determining The End of Battery Life", by S. DeBardelaben, *IEEE*, 1986, pp. 365–368.

"A Look at the Impedence of a Cell", by S. Debardelaben, *IEEE*, 1988, pp. 394–397.

"The Impedance of Electrical Storage Cells", by N. A. Hampson et al., *Journal of Applied Electrochemistry*, 1980, pp.3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp.1–11.

Internal Resistance: Harbinger of Capacity Loss in Starved Electrolyte Sealed Lead Acid Batteries, by Vaccaro, F. J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp.7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standard Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp.1–5.

"A Bridge for Measuring Storage Battery Resistance", by E. Willihncanz, *The Electrochemical Society*, preprint 79–20, Apr. 1941, pp. 253–258.

* cited by examiner

APPARATUS FOR CALIBRATING ELECTRONIC BATTERY TESTER

BACKGROUND OF THE INVENTION

The present invention relates to electronic battery testers of the type used for testing storage batteries. More particularly, the present invention relates to a calibrator for calibrating such electronic battery testers.

Chemical storage batteries, such as lead acid batteries used in automobiles, have existed for many years. In order to make optimum use of such a battery, it is very desirable to test the battery to determine various battery parameters such as state of charge, battery capacity, state of health, the existence of battery defects.

Various techniques have been used to measure battery parameters. For example, hygrometers have been used to measure the specific gravity of a battery and simple voltage measurements have been used to monitor the voltage of the battery. One battery testing technique which has been popular for many years is known as a load test in which a battery is heavily loaded over a period of time and the decay in the battery output is monitored. However, such a test is time consuming and leaves the battery in a relatively discharged condition. Further, such a tester must be made relatively large if it is to be used with large batteries.

A much more elegant technique has been pioneered by Midtronics, Inc. of Burr Ridge, Ill. and Dr. Keith S. Champlin in which battery parameters are determined based upon a measurement of the battery's conductance. This work is set forth in, for example, the following patents: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST.

In general, these more advanced electronic battery testers have used Kelvin connections to couple to terminals of the battery. For example, a first connection in a first Kelvin connection and a second Kelvin connection can be used to apply a forcing function to the battery. A second connection in the first Kelvin connection and a second connection in the second Kelvin connection can be used to measure a response of the battery to the applied forcing function. Typically, the electronic battery tester must be calibrated to ensure that it is performing accurate battery tests. A simple calibration fixture consists of a calibrated resistance in series with a power supply designed to simulate a storage battery. However, there is an ongoing need to improve the accuracy and efficiency of the calibration process.

SUMMARY OF THE INVENTION

A calibration fixture is provided for calibrating an electronic battery tester which has first and second battery tester Kelvin connections configured to couple to terminals of a battery. The calibration fixture includes a first Kelvin connection has an A' terminal and a C' terminal configured to couple to the first battery tester Kelvin connection and a second Kelvin connection having a B' terminal and a D' terminal configured to couple to the second battery tester Kelvin connection. A calibrated shunt is in series with a power supply connected between the A' terminal of the first Kelvin connection and the B' terminal of the second Kelvin connection. The calibrated shunt has a calibrated resistance value. An active shunt is placed in series between the C' terminal of the first Kelvin connection and the D' terminal of the second Kelvin connection. The active shunt provides a calibrated apparent resistance between the C' and D' terminal which is a function of the calibrated resistance value of the calibrated shunt.

DETAILED DESCRIPTION OF THE PREFERRED EMBODIMENTS

Figure 1:
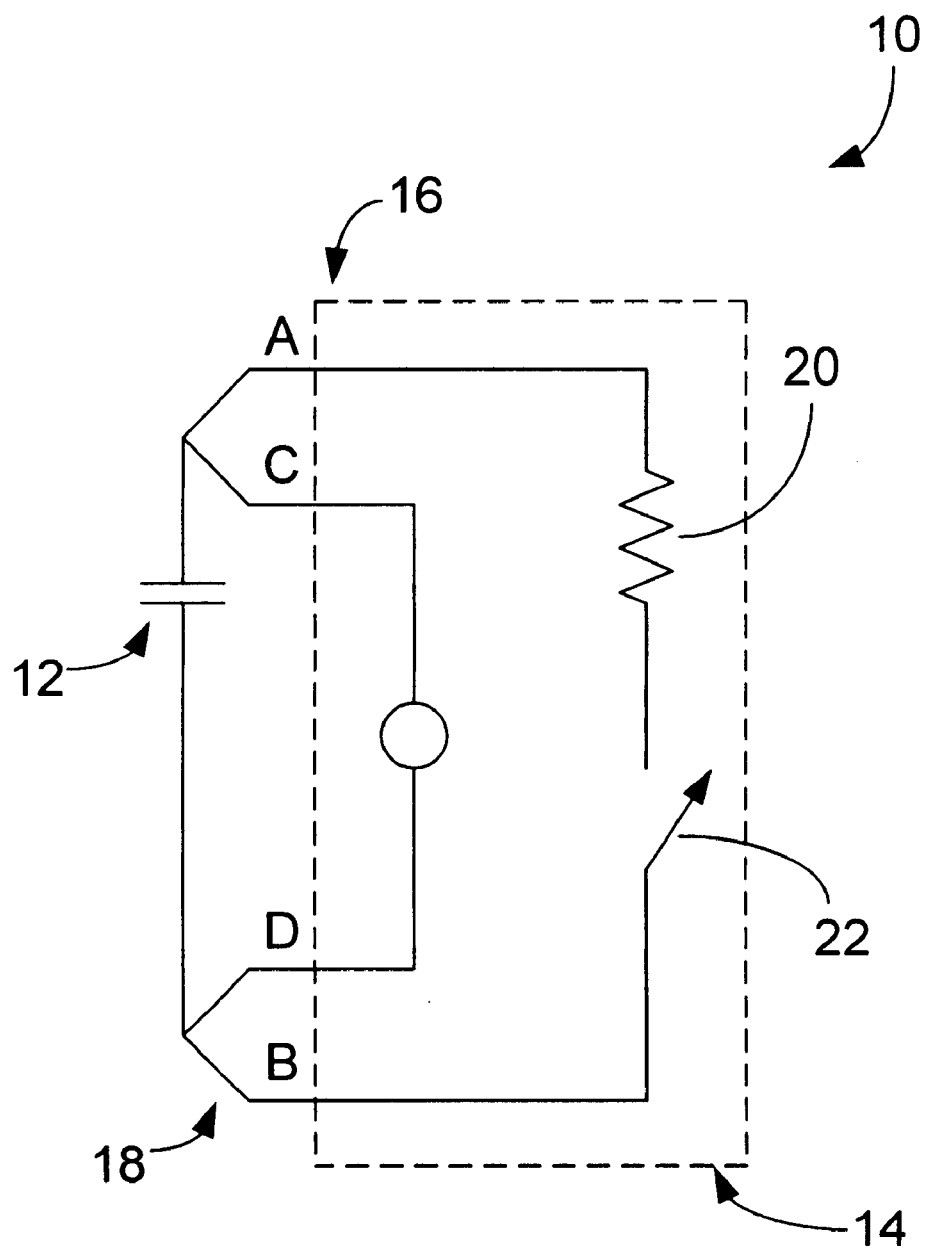
FIG. 1 is a block diagram showing a storage battery coupled to a simplified illustration of an electronic battery tester.

There are many different techniques for testing storage batteries. However, one technique which has been developed by Midtronics, Inc. of Willowbrook, Ill. and Professor Keith S. Champlin uses Kelvin connections to couple to a storage battery. Various aspects of this testing technique are shown and described in the following U.S. patents which are incorporated herein by reference in their entirety. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST.

Such electronic battery testers can typically be calibrated in order to improve the accuracy of their battery test measurements. The present invention provides a calibration fixture which can be used to calibrate, or verify, the accuracy of an electronic battery tester. The present invention provides a calibration fixture which simulates a storage battery.

In one aspect, a parameter of the battery, such as internal conductance, can be adjusted to provide a more versatile calibration technique.

FIG. 1 is a simplified electrical schematic diagram 10 showing a storage battery 12 coupled to an electronic battery tester 14 which utilizes Kelvin connections 16 and 18 to couple to terminals of battery 12. In the simplified diagram of FIG. 1, battery tester 14 includes a resistance 20 which is selectively switched in series with battery 12 using switch 22 coupled in series with an A connection of Kelvin connection 16 and a B connection of Kelvin connection 18. A sensor 24 couples in series with battery 12 through a C connection of Kelvin connection 16 and a D connection of Kelvin connection 18. In this simple example, resistance 20 and switch 22 provide a forcing function. Sensor 24 is configured to observe a response of battery 12 to the applied forcing function. This can be used to determine dynamic conductance, resistance, impedance, admittance, or their combinations. As is now known in the art, this response can be correlated to various parameters of battery 12 for use in testing battery 12. However, the accuracy of such measurements is dependent upon, for example, the accuracy of sensor 24.

Figure 2:
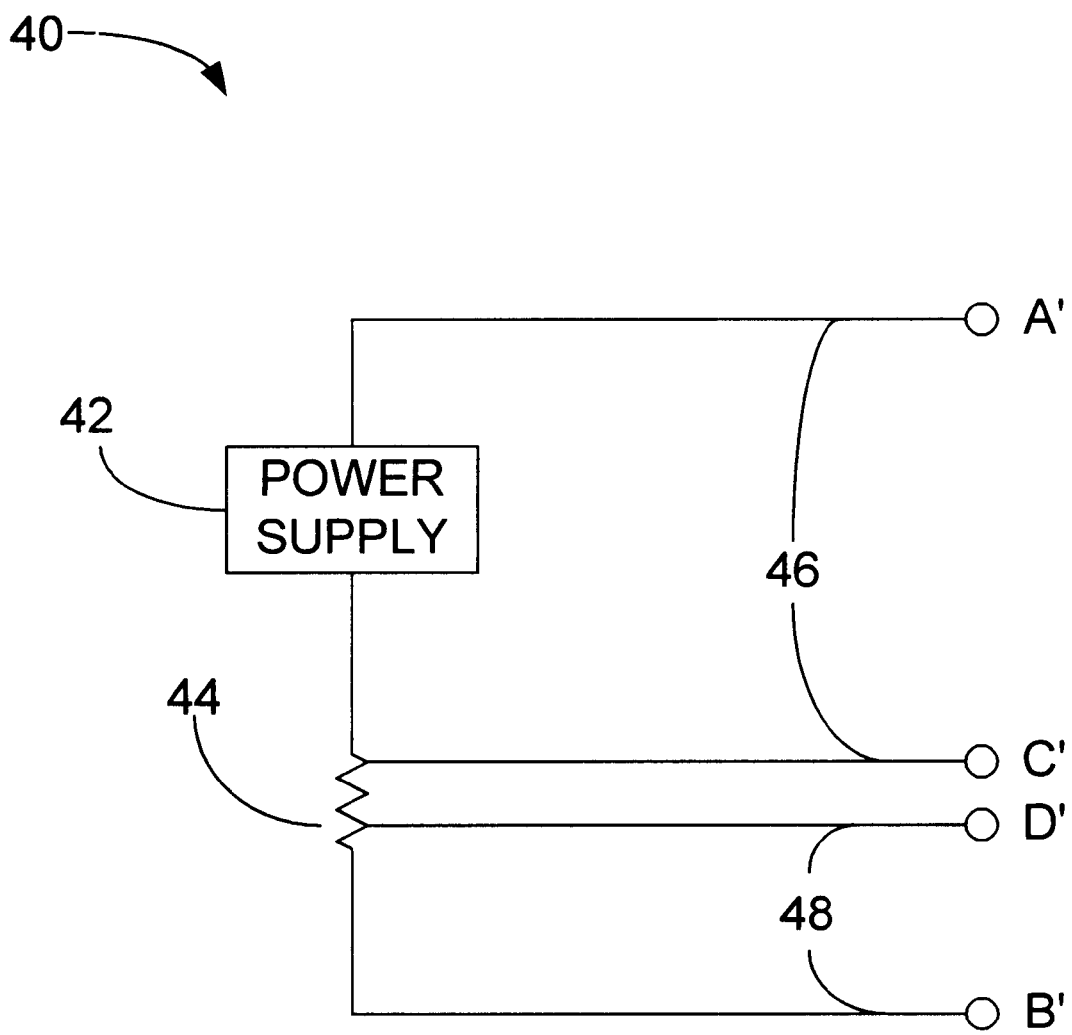
FIG. 2 is a block diagram of a prior art calibration fixture.

FIG. 2 is a diagram of a prior art calibration fixture 40 for use in calibrating an electronic battery tester of the type which utilizes Kelvin connections to couple to a battery. Calibration fixture 40 includes a power supply 42 and a shunt resistance 44. Power supply 42 and shunt resistance 44 are intended to simulate a storage battery such as storage battery 12 shown in FIG. 1. Calibration fixture 40 includes Kelvin connections 46 and 48. Kelvin connection 46 includes an A' and C' connections configured to couple to the A and C connections, respectively, of an electronic battery tester such as those illustrated in FIG. 1. Similarly, Kelvin connection 48 includes B' and D' connections configured to couple to the B and D connections of an electronic battery tester.

In the calibration fixture 40 of FIG. 2, the C' and D' connections couple directly across shunt 44. Shunt 44 should have an accurately known resistance value. Power supply 42 is connected in series with shunt 44. This series combination is coupled between the A' and B' connections. Note that in some electronic battery testers, the battery tester is powered by the battery under test. In such embodiments, power supply 42 is used to power the battery tester being calibrated through the A' and B' connections.

The calibration fixture 40 of FIG. 2 has a number of drawbacks. For example, only a single shunt 44 having a fixed value can be used. If multiple shunts are used which can be selectively switched into the appropriate electrical configuration, the switching circuitry tends to introduce additional resistances which can lead to inaccuracies in the calibration.

FIG. 2 also illustrates that the potential of the C' connection is approximately the same as the potential at the D' connection. In contrast, referring to FIG. 1, with an actual battery 12, the potential of the C connection is different from the D connection by the battery voltage. Further, with an actual battery 12 the A and the C connections are at the same potential. In contrast, with the calibration fixture 40 the A' and the C' connections have a potential difference due to power supply 42. Because the test fixture 40 configuration is different than when testing an actual battery 12, the battery tester must enter a special calibration measurement mode. Additionally, the calibration fixture 40 does not allow the battery tester to measure an actual potential for the C configuration during a conductance (or resistance) measurement. This means that only the conductance can be measured without measuring the voltage. However, typical testing algorithms use both conductance and voltage in performing a battery test. Therefore, the calibration fixture 40 is not capable of calibrating a complete battery test.

Figure 3:
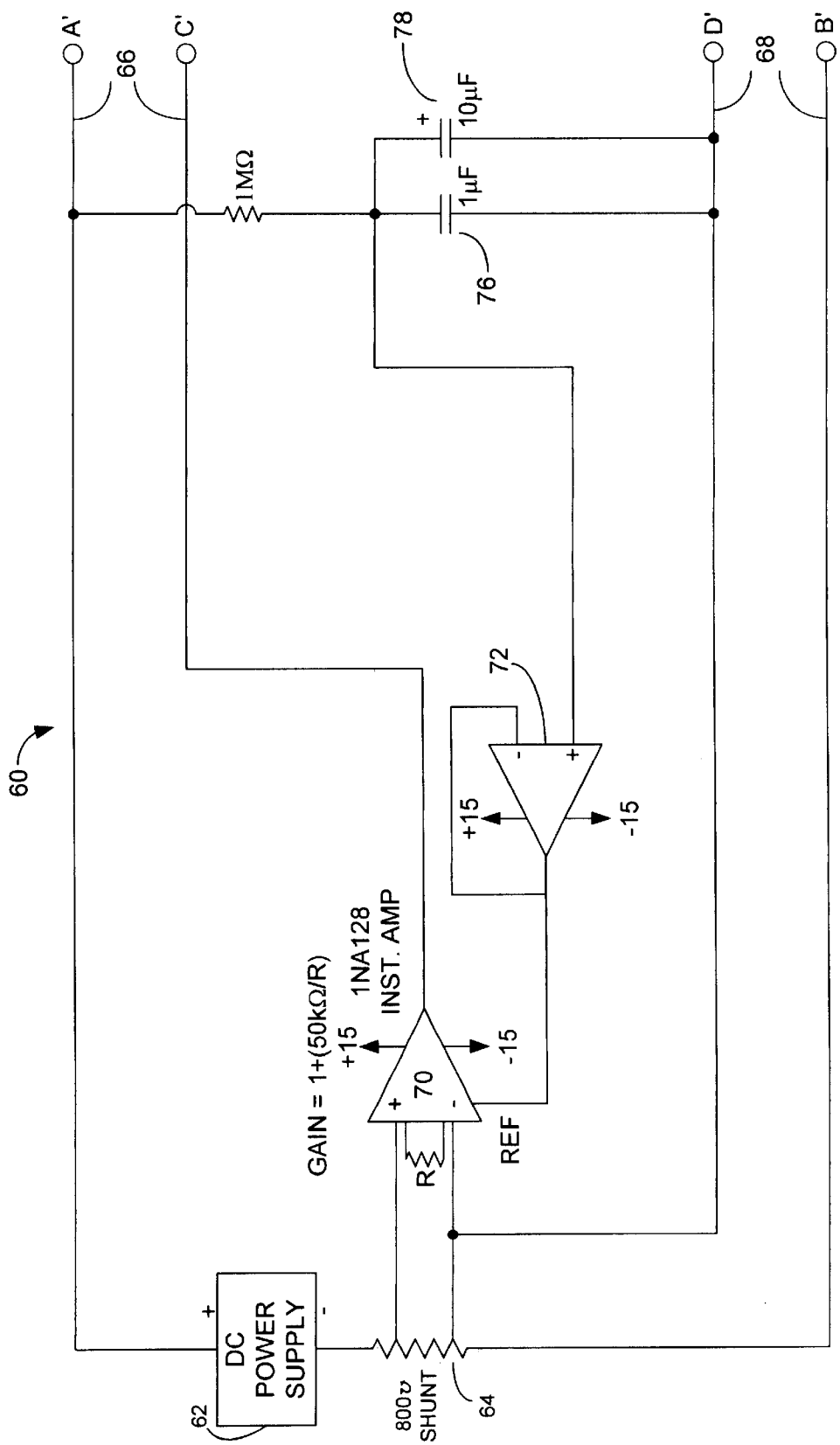
FIG. 3 is an electrical schematic diagram of a calibration fixture in accordance with one embodiment of the present invention.

FIG. 3 is an electrical schematic diagram of an electronic battery tester calibration fixture 60 in accordance with one embodiment of the invention. Calibration fixture 60 includes a power supply 62 connected in series with a shunt 64 between an A' connection of a first Kelvin connection 66 and a B' prime connection of a second Kelvin connection 68. An instrumentation amplifier 70 such as an 1NA128 has inverting and noninverting inputs connected to shunt 64. Amplifier 70 connects to plus and minus 15 volt supplies and a gain control resistance R is also connected to amplifier 70. In general, the output from such an amplifier is related to the gain of the amplifier times the voltage differential of the input. The output is also offset by a voltage related to the voltage at the REF input. A reference level input is received from a differential amplifier 72. The gain of amplifier 70 is equal to 1+(50KΩ/R). The output of amplifier 70 is provided to the C' connection of Kelvin connection 66. The noninverting input of differential amplifier 72 is tied to the A' connection through a 1MΩ resistance. Differential amplifier 72 is connected with negative feedback and with plus and minus 15 volt supplies. The noninverting input of amplifier 72 is also coupled to the E' connection of Kelvin connection 68 through a 1 µF capacitance connected in series with a 10 µF capacitance, 76 and 78, respectively. This provides a large time constant relative to a forcing function of the battery tester. In this example, the circuit has a time constant of 10 seconds whereas typical forcing functions have AC components of 100 Hz.

With the calibration fixture 60 of FIG. 3, the C' potential is substantially the same as an A' potential due to the feedback provided by differential amplifier 72 to instrumentation amplifier 70. Thus, the battery tester does not need to be placed in a special calibration mode in order to function with calibrator 60. The voltage potential between the A' and the B' connections can be adjusted by controlling the DC power supply 62 to provide calibration over a range of different voltages. This can also be used to test operation of the battery tester when connected to a battery having a low voltage to ensure that a battery tester that operates using that voltage is capable of functioning correctly.

In contrast to the prior art shunt 44, the apparent conductance between the C' and D' connections is determined as a function of R coupled to amplifier 70. Specifically, the apparent conductance is equal to the conductance of shunt 64 divided by the gain of amplifier 70. Thus, a battery tester can be easily tested over a range of conductances without having to be coupled to different test fixtures. The value of R can be selected through a manual or a servoed potentiometer through a series of manual or automatic, through a multiplying analog to digital converter, etc. The automatic techniques can be used to allow a microprocessor to control the value of the apparent conductance.

Figure 4:
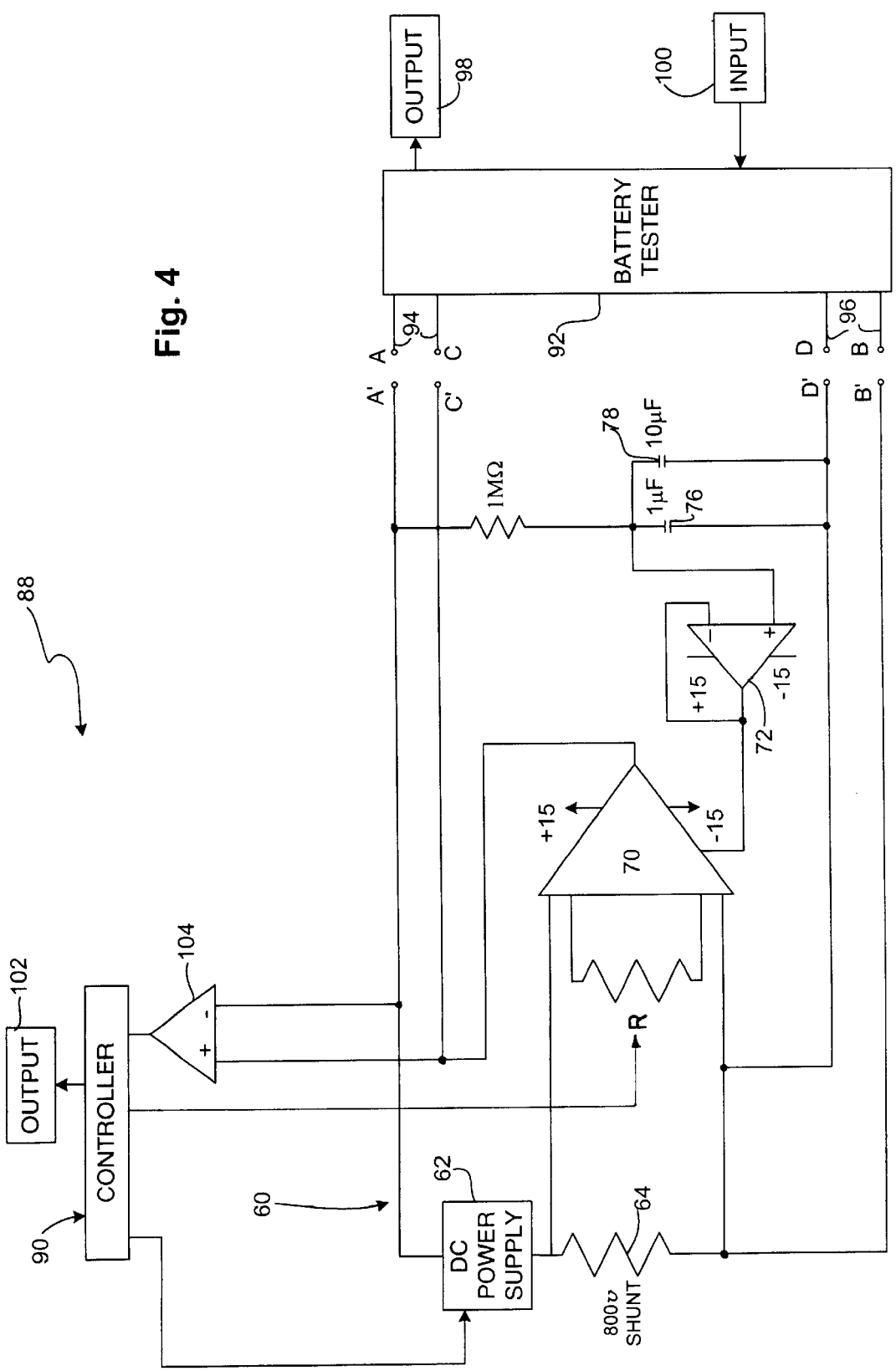
FIG. 4 is a simplified block diagram showing one example calibration fixture including a controller.

FIG. 4 is a simplified schematic diagram showing a calibration fixture 88 in accordance with another example embodiment. Calibration fixture 88 includes circuitry 60 similar to that shown in FIG. 3. However, circuitry 70 is configured to operate under the control of a controller 90 which is capable of adjusting the apparent conductance, by controlling resistor R, and adjusting the power provided by DC power supply 62. In one embodiment, controller 90 is configured to communicate with a battery tester 92 having Kelvin connections 94 and 96. Battery tester 92 also has an output 98 and an input 100 for receiving or outputting information.

In the embodiment of FIG. 4, an automated calibration process can be provided. For example, controller 90 can communicate with battery tester 92 to provide calibration data to be stored in battery tester 92 to eliminate inaccuracies in subsequent battery tests. The testing can be repeated until the error is within an acceptable range.

Controller 90 can also be used to provide a "ready to test" output such as output 102 or such an output can be provided to battery tester 92. Capacitors 76 and 78 along with the 1 MΩ resistance provide a relatively long time constant compared with the forcing function frequency of a typical battery tester 92. Calibration fixture 88 can be used when the voltage difference between the A' and the C' connections are at a sufficiently low level, for example, 10 mV, or below the resolution of the battery tester 92. For example, a comparator 104 coupled to the A' and C' connections can provide an output to controller at a desired threshold. A comparison of the A'-B' and C'-D' voltages can also be used. In one aspect of the invention, the calibration fixture provides a more complex model of the battery under test. For example, the circuits of FIGS. 2, 3 and 4 provide a simple resistive model for the battery. However, capacitors and inductors can be provided along with active circuitry as necessary and additional resistances to model any battery configuration or transfer function representative of a battery.

Although the present invention has been described with reference to preferred embodiments, workers skilled in the art will recognize that changes may be made in form and detail without departing from the spirit and scope of the invention.

What is claimed is:

1. An apparatus for calibrating an electronic battery tester, the battery tester of the type having first and second battery tester Kelvin connections configured to couple to terminals of a battery, the apparatus comprising:

a first Kelvin connection having an A' terminal and a C' terminal configured to couple to the first battery tester Kelvin connection;

a second Kelvin connection having a B' terminal and a D' terminal configured to couple to the second battery tester Kelvin connection;

a calibrated shunt in series with a power supply connected between the A' terminal of the first Kelvin connection and the B' terminal of the second Kelvin connection, the calibrated shunt having a calibrated resistance value; and an active shunt in series connected between the C' terminal of the first Kelvin connection and the D' terminal of the second Kelvin connection, the active shunt providing a calibrated apparent resistance between the C' and D' terminals which is a function of the calibrated resistance value of the calibrated shunt.

2. The apparatus of claim 1 wherein the active shunt comprises a differential amplifier having differential inputs connected across the calibrated shunt.

3. The apparatus of claim 2 wherein an output of the differential amplifier is offset by a reference voltage.

4. The apparatus of claim 3 wherein the reference voltage is related to a voltage at the D' terminal.

5. The apparatus of claim 1 wherein the calibrated apparent resistance is a function of an adjustment to the active shunt.

6. The apparatus of claim 1 wherein the active shunt comprises a differential amplifier and the calibrated apparent resistance is a function of a gain of the differential amplifier.

7. The apparatus of claim 6 wherein the active shunt includes a resistance and the gain of the differential amplifier is a function of the resistance.

8. The apparatus of claim 7 wherein the resistance is an adjustable resistance.

9. The apparatus of claim 1 wherein a transfer function between the C' and D' terminals is frequency dependent.

10. The apparatus of claim 1 including a controller configured to control operation of the active shunt.

11. The apparatus of claim 1 wherein the controller is configured to communicate with the electronic battery tester.

12. The apparatus of claim 1 wherein the power supply is configured to provide a power supply voltage between the A' and B' terminals to power the electronic battery tester.

13. The apparatus of claim 1 wherein the active shunt receives a feedback signal from the A' and D' terminals.

14. The apparatus of claim 13 wherein the feedback signal has a relatively long time constant in comparison to an AC component of a forcing function of the electronic battery tester.

15. The apparatus of claim 13 wherein the feedback signal is provided to the active shunt through a battery amplifier.

16. The apparatus of claim 11 wherein the controller provides calibration related information to the electronic battery tester.

17. A method of calibrating an electronic tester, the battery tester of the type having first and second battery tester Kelvin connections configured to couple to terminals of a battery, the method comprising:

connecting a first Kelvin connection having an A' terminal and a C' terminal to the first battery tester Kelvin connection;

connecting a second Kelvin connection having a B' terminal and a D terminal to the second battery tester Kelvin connection;

providing a calibrated apparent resistance between the C' and D' terminals which is a function of a calibrated shunt coupled in series with a power supply between the A' and B' terminals.

18. The method of claim 17 including communicating calibration information to the electronic battery test.

19. The method of claim 17 including adjusting the calibrated apparent resistance.

20. The method of claim 19 wherein adjusting the calibrated apparent resistance comprises adjusting a gain of a differential amplifier.

\* \* \* \* \*